United States Patent [19]

Barzynski et al.

[11] Patent Number: 4,515,877

[45] Date of Patent: May 7, 1985

[54] IMAGE-RECORDING MATERIALS AND IMAGE-RECORDING CARRIED OUT USING THESE TO PRODUCE AN OPTICAL MASK

[75] Inventors: Helmut Barzynski, Bad Durkheim; Klaus Holoch, Bobenheim-Roxheim, both of Fed. Rep. of Germany

[73] Assignee: BASF Aktiengesellschaft, Fed. Rep. of Germany

[21] Appl. No.: 554,327

[22] Filed: Nov. 22, 1983

[30] Foreign Application Priority Data

Nov. 27, 1982 [DE] Fed. Rep. of Germany ....... 3243943

[51] Int. Cl.$^3$ ............................................... G03F 9/00
[52] U.S. Cl. ....................................... 430/5; 430/270; 430/330; 430/346; 430/495; 430/945; 428/913; 346/200; 346/216
[58] Field of Search ...................... 430/5, 7, 270, 330, 430/346, 945, 944; 346/216, 200, 495; 428/913; 282/27 R

[56] References Cited

U.S. PATENT DOCUMENTS 4,225,659 9/1980 Drexler .................................... 430/5
4,450,023 5/1984 De Blauwe ............................ 156/64

FOREIGN PATENT DOCUMENTS 1385241 2/1975 United Kingdom .
1548439 7/1979 United Kingdom .
2081467 2/1982 United Kingdom ................ 428/913

Primary Examiner—John E. Kittle
Assistant Examiner—José G. Dees
Attorney, Agent, or Firm—Keil & Weinkauf

[57] ABSTRACT

A resist film comprises a dimensionally stable base (B), which is transparent to actinic light in the wavelength range from 300 to 420 nm, and a mask-forming layer (ML) which is sensitive to heat radiation and contains a thermochromic system which, when irradiated with an IR laser having a wavelength greater than 1.00 μm, undergoes an irreversible change in its absorption spectrum in the wavelength range from 300 to 420 nm so that the optical density of the mask-forming layer (ML) in this wavelength range changes by not less than 1.3 units. The base of the resist film can also be applied onto the photosensitive relief-forming layer (RL) of a recording material to give a multilayer image-recording material. Imagewise irradiation with heat, for example using an IR laser, produces, in the mask-forming layer (ML) of the resist film, a UV photomask which is very useful for exposing photosensitive recording materials.

7 Claims, No Drawings

IMAGE-RECORDING MATERIALS AND IMAGE-RECORDING CARRIED OUT USING THESE TO PRODUCE AN OPTICAL MASK

The present invention relates to a mask film which comprises a dimensionally stable base, which is transparent to actinic light in the wavelength range from 300 to 420 nm, and a mask-forming layer which is applied on the base and is sensitive to heat radiation. The present invention furthermore relates to a process for the production of relief images, wherein a mask containing an image which is opaque to actinic radiation is produced by imagewise heat-treatment of the resist film, and thereafter a photosensitive recording material is exposed through this mask and the relief image is developed in a conventional manner.

To produce relief images, for example letter-press printing plates, lithographic printing plates or resist images, photosensitive recording materials are generally used today, these materials being exposed imagewise to actinic light. Depending on whether the photosensitive recording material is negative-working or positive-working, the unexposed or the exposed areas of the relief-forming layer are then removed, generally by washing out with a solvent, to form the relief. For imagewise exposure of these recording materials, mask films which contain an image which is opaque to actinic radiation are used, and the image in the mask should have very high contrast (for example, the image areas should be completely opaque and the image-free areas completely transparent).

To produce mask films, photographic silver-containing films are generally used today, but these are expensive and troublesome to handle. It is therefore very desirable to have silver-free films for the production of photomasks. For example, it has been disclosed that photomasks can be produced from photosensitive silver-free layers by subjecting these layers to image-wise exposure to produce an image of high optical density (cf. for example German Laid-Open Applications DOS No. 2,202,360 and DOS No. 2,149,059, German Published Application DAS No. 2,651,864 and German Published Application DAS No. 2,821,053). Up to the present time, however, such mask films have not played any significant role in practice because they have to be developed with a solvent, and the resulting relief image is sensitive to mechanical abrasion in the areas containing small image dots. There is therefore a need for economical, easily handled resist films for the production of photomasks.

It is an object of the present invention to provide silver-free resist films which make it possible simply and rapidly to produce photomasks which can be used for the imagewise exposure of photosensitive recording materials. The resist films should give, in particular, photomasks which have high, crisp contrast between the image areas and the image-free areas for light of wavelength 300–420 nm, are long-lasting and hard-wearing and permit exact image reproduction faithful to the original, even in the case of fine elements.

We have found that this object is achieved, in accordance with the invention, by a resist film which comprises a dimensionally stable base, which is transparent to actinic light, and a mask-forming layer which is applied on the base, wherein the said layer contains a thermochromic system which, when irradiated with an IR laser having a wavelength greater than 1.00 $\mu$m, undergoes an irreversible change in its absorption spectrum in the range from 300 to 420 nm so that the optical density in this wavelength range changes by not less than 1.3 units.

The present invention accordingly relates to a resist film which comprises a dimensionally stable base (B), which is transparent to actinic light in the wavelength range from 300 to 420 nm, and a mask-forming layer (ML) which is applied on the base, wherein the said layer (ML) is sensitive to heat radiation and contains a thermochromic system which, when irradiated with an IR laser having a wavelength greater than 1.00 $\mu$m, undergoes an irreversible change in its absorption spectrum in the range from 300 to 420 nm so that the optical density of the mask-forming layer (ML) in this wavelength range changes by not less than 1.3 units.

In a special embodiment of the invention, that surface of the resist film which is opposite the mask-forming layer (ML) is applied directly onto the photosensitive relief-forming layer of a photosensitive recording material.

The present invention furthermore relates to a process for the production of a photomask by imagewise irradiation of the resist film using an IR laser, and to a process for the production of relief images, wherein the mask-forming layer of the multilayer element comprising the resist film and the photosensitive recording material is first irradiated imagewise, using an IR laser, to form a photomask, the photosensitive relief-forming layer is then exposed to actinic light through the photomask, the latter is removed from the photopolymeric relief-forming layer, and the relief image is developed by washing out the relief-forming layer with a solvent.

The base (B) of the novel resist film should be dimensionally stable and transparent to actinic light in the wavelength range from 300 to 420 nm. Particularly suitable base materials are plastic films or foils which are stable to heat radiation and retain their transparency to actinic light in the said wavelength range even after the mask-forming layer (ML) has been subjected to heat radiation by means of an IR laser. Films or foils of polyesters, eg. polyethylene terephthalate or polybutylene terephthalate, have proven particularly useful. The base (B) of the resist film is usually from 8 to 150, preferably from 10 to 30, $\mu$m thick.

In accordance with the invention, the mask-forming layer (ML) of the resist film contains a thermochromic system which, when irradiated with an IR laser having a wavelength greater than 1.00 $\mu$m, undergoes an irreversible change in its absorption spectrum in the range from 300 to 420 nm. The thermochromic system can be such that the mask-forming layer (ML), before being irradiated with the IR laser, has a low optical density of less than 0.5, preferably not more than 0.35, in the stated wavelength range, the optical density increasing as a result of irradiation with the IR laser. In this case, the optical density of the mask-forming layer (ML) in the irradiated areas, after irradiation with the IR laser, is not less than 1.8, preferably greater than 3.0, in the wavelength range from 300 to 420 nm.

The thermochromic system in the mask-forming layer (ML) may, however, also be such that the said layer has a high optical density of not less than 1.8, preferably above 3.0, in the said wavelength range before being exposed to heat radiation, the optical density in the said wavelength range decreasing as a result of exposure to heat radiation. In this case, the optical density of the mask-forming layer (ML) in the irradiated areas, after irradiation with the IR laser, is not more than 0.5, in particular not more than 0.35, in the range from 300 to 420 nm.

The thermochromic systems for the novel resist films generally consist of an organic substance, which, under the influence of activators, eg. radicals, acids, bases or oxidizing agents, undergoes rearrangement or conversion to a form which possesses different absorption characteristics with respect to actinic light in the wavelength range from 300 to 420 nm, and the stated activator which, under the action of heat, effects the conversion of the absorbing substance.

Organic substances which are capable of altering their absorption characteristics with respect to actinic light of the stated wavelength range include aromatic amines, aromatic phenols, cyanines, merocyanines, aromatic triazoles, aromatic lactones and aromatic lactams (in the acidic or basic form in each case), stilbenes, azomethines and oxidizable aromatic hydrols. Examples of such substances are Michler's ketone, p-dimethylaminobenzaldehyde or its hydrochloride, o-hydroxyphenylbenzotriazole, o-hydroxybenzophenone or its sodium phenolate, 4,4'-bis(dimethylamino)benzhydrol and tetraphenylethylene. A preferred class of such compounds comprises the aromatic amines and their hydrochlorides.

Examples of suitable activators which, under the action of heat, alter the absorption characteristics of the organic substance are compounds which, under the action of heat, decompose to give radicals, eg. azodiisobutyronitrile or dicumyl or benzoyl peroxide, and organic compounds which, under the action of heat, eliminate acids or bases, eg. phenolates, hydrochlorides or hydrobromides of aromatic amines, diazoquinones, sulfonates, nitro compounds of nitrates. Particularly advantageous activators are the sulfonates, in particular those based on aromatic sulfonic acids, eg. benzenesulfonic acid or toluenesulfonic acid, and secondary alcohols, eg. butan-2-ol, butane-2,3-diol or cyclohexanol. The type of activator used in the thermochromic system depends, inter alia, on the particular organic substance with the changeable absorption characteristics.

Examples of thermochromic systems used according to the invention, and in which the absorption of actinic light in the wavelength range from 300 to 420 nm increases under the action of heat, are Michler's ketone hydrochloride/toluenesulfonic acid, p-dimethylaminobenzaldehyde hydrochloride/toluenesulfonic acid and iron stearate/mercaptobenzimidazole. Examples of thermochromic systems used according to the invention, and in which the absorption of actinic light in the said wavelength range decreases under the action of heat, are azodiisobutyronitrile/tetraphenylethylene, naphtho-o-quinonediazide/Na phenolate, N-chloracetamide/glutaconic dialdehyde Na and ethyl trichloroacetate/nitroform potassium.

Thermochromic systems which have proven very particularly useful for the novel resist films are those which contain, as activators, the stated sulfonates, eg. butane-2,3-diol ditosylate, benzyl tosylate, cyclohexyl tosylate or hexane-2,5-diol ditosylate, and, as the organic substance with the changeable absorption characteristics with respect to actinic light, in particular aromatic amines, such as 4,4'-bisaminobenzophenones, eg. Michler's ketone or its derivatives, p-dimethylaminobenzaldehyde, 2-dimethylaminoanthraquinone, 2-hydroxyphenylbenzotriazole, dialkylaminobenzoates, potassium 2,4-dinitrophenolate, p-nitrosodimethylaniline or p-dimethylaminoazobenzene.

The ratio of the absorbing organic substance to the activator in the thermochromic system can vary within wide limits. However, the amount of activator present must be no less than that required for changing the absorption characteristics and hence the optical density. The thermochromic systems can contain, for example, from 1 to 70 mole % of the absorbing organic compound and from 30 to 99 mole % of the activator, the percentages being based on the sum of the absorbing organic compound and the activator in each case. Preferably, the thermochromic system contains more than 50 mole % of the activator.

Although not absolutely necessary, it is, however, very advantageous and expedient if the thermochromic system in the mask-forming layer (ML) is employed together with a binder. This binder is used, in particular, to achieve good adhesion of the thermochromic system to the base (B). The binder itself must be thermally stable and transparent to actinic light in the wavelength range from 300 to 420 nm. The binder must retain this transparency to actinic light even after exposure to heat radiation, for example with an IR laser. Particularly suitable binders are thermally stable transparent film-forming polymers, eg. polystyrene, polyvinyl chloride, polyvinyl alcohol, polymethyl methacrylate, nylons, polyurethanes and polycarbonates.

The mask-forming layer (ML) can also contain further additives, for example plasticizers for the polymeric binders, polymer stabilizers, fillers, pigments and, in particular, dyes and/or visible thermochromic indicator systems, ie. systems which undergo a change in color (absorption characteristics in the wavelength range of visible light) under the action of heat. These are generally systems which contain a color-producing substance, which is usually colorless or only slightly colored, and an activator which, when the system is heated, causes the color-producing substance to produce a coloration. Particularly suitable color-producing substances are the leuco bases and leuco-lactone forms of diphenylmethane, triphenylmethane, fluorane, phenothiazine, xanthene, thioxanthene, spiropyran or acridine dyes. Suitable activators are the compounds stated further above, in particular acidic organic compounds, eg. phenols, and preferably the sulfonic acid esters, very particularly the tosylates. The addition of the visible thermochromic indicator system to the mask-forming layer (ML) results, when the novel resist film is subjected to heat radiation, not only in a change in the absorption characteristics in the wavelength range from 300 to 420 nm, this change being important for photomask applications, but, at the same time, also in a change in the color of the mask-forming layer (ML) so that the heat-irradiated and the non-heat-irradiated areas of the resist film are also clearly distinguishable visually. This facilitates in particular the handling and use of the novel resist films.

The amount of thermochromic system in the mask-forming layer (ML) of the novel resist film depends, inter alia, particularly on the desired optical density of the said layer. Depending on the thickness of the mask-forming layer (ML), the amount should be such that, after the stated layer has been subjected to heat radiation, the absorbing areas have an optical density of not less than 1.8, preferably not less than 3.0, in the wavelength range from 300 to 420 nm, and the non-absorbing areas have an optical density of not more than 0.5, in particular not more than 0.35, in the stated wavelength range. The mask-forming layer (ML) is usually from 1 to 50, in particular from 2 to 20, μm thick. Preferably, the composition of the mask-forming layer (ML) is such that the heat radiation used in the production of the photomask is very substantially absorbed by the said layer. Accordingly, the absorption characteristics of the components of the mask-forming layer (ML) should preferably be matched to the heat radiation employed when the resist film is used, or to the IR laser used.

To produce the novel resist film, the components of the mask-forming layer (ML) are mixed together thoroughly and homogeneously, and this mixture is then applied onto the base (B) to give a layer of the desired thickness. This can be carried out using the conventional mixing and coating methods. Preferably, the components of the mask-forming layer (ML) are dissolved in a solvent, the solution is cast onto the base (B), the solvent is evaporated and the mask-forming layer (ML) is dried.

The resist films according to the invention are very suitable for the production of photomasks as used, for example, in the production of printing plates or relief plates from photopolymerizable recording materials. To produce such photomasks, the mask-forming layer (ML) is subjected to imagewise irradiation with heat, preferably using an IR laser having a wavelength greater than 1.00 μm. Examples of IR lasers which can be used, in accordance with the invention, for the production of the photomasks are $CO_2$ lasers, CO lasers and YAG lasers. Imagewise irradiation of the mask-forming layer (ML) is advantageously carried out as follows: the image-bearing transparency is scanned by means of a read laser, and the electrical information obtained, if necessary after intermediate storage, is passed on to a write laser, which then subjects the resist film to heat radiation in dots and lines, in accordance with the bright/dark information from the image-bearing transparency. The intensity of the laser should be very high, ie. in the range of a few watt, in order to achieve large localized temperature increases, this being advantageous for the crispness of the dots. The laser beam can be moved to and fro over the mask film by means of a polygonal mirror system, or it can irradiate the mask film on a rotating drum. The energy per unit area is usually from 0.2 to 2 J/cm$^2$.

The photomasks produced using the novel resist films have crisp, exact image contours which are faithful to the original. Depending on the type of write laser used, it is also impossible to achieve very high resolution. Moreover, the heat-irradiated and non-heat-irradiated areas of the resist film differ greatly in optical density in the wavelength range from 300 to 420 nm. They are therefore very useful in reprography as photomasks for production of relief images; to do this, the mask film is placed on a photosensitive recording material, and the latter is exposed to actinic light through the mask film and then developed.

For this purpose, the novel resist film, before being subjected to heat radiation with the IR laser, can also be bonded to a photosensitive recording material in the form of a multilayer element. This special embodiment of the invention hence comprises a multilayer image-recording material having the following layers arranged one on top of the other in the sequence stated: a dimensionally stable support (S), a photosensitive relief-forming layer (RL), a dimensionally stable intermediate layer (I) which is transparent to actinic light in the wavelength range from 300 to 420 nm and corresponds to the base (B) of the resist film described above, a mask-forming layer (ML) which is sensitive to heat radiation and corresponds to the mask-forming layer (ML) described above, and, if required, a top layer (T).

Suitable supports (S) for the multilayer image-recording material are the dimensionally stable rigid or flexible bases conventionally used for photosensitive, in particular photopolymerizable, recording materials. These include, in particular, plastic films or foils, for example or polyesters, such as polyethylene terephthalate or polybutylene terephthalate, or metal sheets or metal-coated substrates, eg. aluminum sheet, steel sheet, copper sheet or copper-coated boards for the production of printed circuits. The support (S) may be mechanically and/or chemically pretreated or provided with an adhesive layer in order to ensure good adhesion to the photosensitive relief-forming layer (RL). Such an adhesive layer can consist, for example, of the conventional single-component or two-component adhesives, for example those based on polyurethane. The support (S) can also carry an antihalation layer.

Suitable materials for the photosensitive relief-forming layer (RL) are those conventionally used for photosensitive recording materials. In addition to positive-working systems, for example those based on o-quinonediazide (cf. German Laid-Open Applications DOS No. 2,028,903 and DOS No. 2,236,941) or on polymers containing o-nitrocarbinol ester groups (cf. German Published Applications DAS No. 2,150,691 or DAS No. 2,922,746), the negative-working photopolymerizable and/or photocrosslinkable systems should be particularly singled out. These generally consist of a mixture of one or more polymeric binders, one or more ethylenically unsaturated, photopolymerizable, low molecular weight compounds and one or more photo-initiators, with or without other additives. Suitable polymeric binders for producing a photopolymerizable and/or photocrosslinkable relief-forming layer (RL) are the solvent-soluble or solvent-dispersible nylons, polyurethanes, saturated or unsaturated polyesters, polyester-urethanes, polyether-urethanes, styrene polymers, acrylate and methacrylate polymers and copolymers, polyvinyl alcohol and its derivatives, butadiene and/or isoprene polymers and others. Examples of particularly advantageous polymers are nylon copolymers as described in French Pat. No. 1,520,856 or in German Laid-Open Application DOS No. 2,202,357; vinyl alcohol polymers, particularly the conventional hydrolyzed polyvinyl esters of aliphatic monocarboxylic acids of 1 to 4 carbon atoms, eg. polyvinyl acetates or polyvinyl propionates having a mean degree of polymerization of from 200 to 3,000 and a degree of hydrolysis of from 65 to 99 mole %; acrylate or methacrylate polymers, in particular the polymers of alkyl acrylates or methacrylates where alkyl is of 1 to 8 carbon atoms; elastomeric diene/styrene copolymers, in particular multi-block copolymers of styrene and butadiene and/or isoprene; or butadiene and/or isoprene rubbers, eg. butadiene/acrylonitrile copolymers containing from 15 to 40% by weight of acrylonitrile.

Particularly suitable ethylenically unsaturated, photopolymerizable low molecular weight compounds for the photopolymerizable and/or photocrosslinkable relief-forming layers (RL) are low molecular weight compounds of the acrylic type, ie. acrylates and methacrylates as well as acrylamides and methacrylamides and their derivatives, the choice of the ethylenically unsaturated low molecular weight compound depending, inter alia, on the particular polymeric binder used. Examples of ethylenically unsaturated low molecular weight compounds are the di-, tri- and tetraacrylates and -methacrylates of diols, triols or tetraols, eg. di- or polyacrylates or -methacrylates of ethylene glycol, diethylene glycol, triethylene glycol, polyethylene glycol having a molecular weight as high as about 500, propane-1,2-diol, propane-1,3-diol, butane-1,4-diol, neopentylglycol, glycerol or trimethylolpropane. Other suitable compounds are the monoacrylates or monomethacrylates of the stated diols and polyols, as well as the acrylates and methacrylates of monoalcohols of 1 to 8 carbon atoms, eg. methanol, ethanol, butanol, hexanol or 2-ethylhexanol. Examples of acrylamide and methacrylamide compounds, in addition to acrylamide and methacrylamide themselves, are ethylene glycol bisacrylamide, ethylene glycol bismethacrylamide, methylene bisacrylamide and methylene bismethacrylamide.

The photopolymerizable and/or photocrosslinkable relief-forming layers (RL) contain the polymeric binders and the ethylenically unsaturated, photopolymerizable low molecular weight compounds in general in a weight ratio of from 50:50 to 90:10. Suitable photoinitiators are the conventional ones, used in amounts of from 0.001 to 10, preferably from 0.01 to 5, % by weight, based on the photopolymerizable relief-forming layer (RL). Examples include benzoin and benzoin compounds, eg. benzoin methyl ether, α-methylbenzoin ethyl ether, α-methylolbenzoin methyl ether or benzoin isopropyl ether; benzil, benzil ketals, eg. benzil dimethyl ketal or benzil methylbenzyl ketal; and acylphosphine oxides as described in, for example, German Laid-Open Application DOS No. 2,909,992. The photopolymerizable and/or photocrosslinkable relief-forming layers (RL) can furthermore contain other conventional additives, eg. thermal polymerization inhibitors, dyes, pigments, sensitizers, antioxidants, fillers, plasticizers, lubricants, etc.

The intermediate layer (I) of the multilayer image-recording materials corresponds to the base (B) of the resist film described above. It should be dimensionally stable and transparent to actinic light in the wavelength range of from 300 to 420 nm. Furthermore, it should be stable to heat radiation and, after it has been subjected to heat treatment, its absorption spectrum in the stated wavelength range should have changed only insignificantly, if at all. Preferably, the intermediate layer (I) consists of a transparent film-forming polymer, in particular polyethylene, polypropylene, a polyester, eg. polyethylene terephthalate or polybutylene terephthalate, polystyrene, a polycarbonate or polyvinyl chloride. The intermediate layer (I) serves, in particular, to prevent diffusion of components of the thermochromic layer (ML) into the photosensitive relief-forming layer (RL) and vice versa, and generally exhibits only moderate adhesion to the photosensitive relief-forming layer (RL). Hence, as a result of the presence of this layer, the mask-forming thermochromic layer (ML) can be readily removed, by peeling, from the photosensitive relief-forming layer (RL) after exposure of the latter layer to actinic light and before development of the relief image. The intermediate layer (I) is preferably from 5 to 135, in particular from 8 to 15, μm thick.

On top of the intermediate layer (I) is the mask-forming layer (ML) which is sensitive to heat radiation. This layer (ML) of the multilayer image-recording material contains the same components, and is produced in the same manner, as the mask-forming layer (ML) of the resist film as such, which is described above.

If desired, a top layer (T), in particular as a protective layer, may also be present on the heat-sensitive mask-forming layer (ML) of the multilayer image-recording material as well as on the mask-forming layer (ML) of the resist film as such. This top layer (T) can consist of a conventional film-forming polymer, eg. polyethylene, polypropylene, polyvinyl chloride, polyvinyl alcohol, polystyrene or the like, and is advantageously peeled off from the said layer (ML) before this layer is subjected to imagewise irradiation with heat.

The multilayer image-recording materials can be produced in a conventional manner, for example by placing the individual layers one on top of the other and bonding them to one another. Advantageously, the procedure is carried out as follows: first, a laminate comprising the support (S) and the photosensitive relief-forming layer (RL) and a laminate comprising the intermediate layer (I) and the heat-sensitive mask-forming layer (ML) with or without the top layer (T) are produced, and then the free surfaces of the intermediate layer (I) and of the photosensitive relief-forming layer (RL) are bonded together by lamination, pressing or the like, in the presence or absence of an auxiliary solvent.

The production of a relief image using the novel multilayer image-recording material is carried out as follows: first, if necessary after the top layer (T) has been removed, the mask-forming layer (ML) is subjected to imagewise irradiation with heat, in particular using an IR laser having a wavelength greater than 1.00 μm. For this imagewise irradiation of the said layer (ML) with heat, the appropriate statements made above apply. The photosensitive relief-forming layer (RL) underneath the resulting mask layer is then exposed, through this mask layer, to actinic light having a wavelength of from 300 to 420 nm. In addition to, for example, carbon arc lamps, in particular high-pressure mercury lamps, high-pressure xenon lamps and, preferably, low-pressure mercury fluorescence lamps are used for this purpose. The periods of exposure to actinic light are in general from about 0.5 to 10 minutes, depending on the type of photosensitive relief-forming layer (RL). After this exposure, the intermediate layer (I) together with the mask layer (ML) is removed from the exposed relief-forming layer (RL), and the relief is developed in a conventional manner, in general by washing out the layer with a suitable solvent.

The particular advantage of this procedure is that information stored by a computer or magnetic recording material can be used directly, without the intermediate stage of the reprographic film, for the production of a printing plate. Another advantage is the use of infrared lasers, which are known to have a very high output compared with other lasers; this results in a high recording speed. Moreover, in accordance with the invention, all developing or fixing steps, either wet or dry, are dispensed with in the production of the mask, and the use of the multilayer element in the production of an image ensures uniform, good quality during processing.

The Examples which follow illustrate the invention. Parts and percentages are by weight, unless stated otherwise.

EXAMPLE 1

This example describes the production of a positive-working UV mask, using a resist film according to the invention.

50 parts of polystyrene, 40 parts of benzyl tosylate, 2 parts of Michler's ketone and 0.04 part of hexamethylenediamine were dissolved in 500 parts of ethyl acetate, and the solution was filtered through a pressure filter having a pore size of 2 μm and then cast on a 10 μm thick polypropylene film in an amount such that, after drying, the resulting heat-sensitive mask-forming layer was 15 μm thick.

The slightly yellow resist film produced in this manner was irradiated with a 4 W $CO_2$ laser through a metal mask having a line pattern, irradiation energy of $J/cm^2$ falling on the light image sections of the film. The width of the laser beam was about 0.11 mm. The optical transmission of the resist film at 366 nm changed from 0.5% (corresponding to an optical density of about 2.3) to 85% (corresponding to an optical density of about 0.07).

EXAMPLE 2

This example describes the production of a photopolymeric letterpress printing plate, using a multi-layer image-recording material according to the invention.

A solution of 520 parts of polymethyl methacrylate, 160 parts of cyclohexyl tosylate, 20 parts of Michler's ketone, 300 parts of tricresyl phosphate, 0.6 part of hexamethylenediamine and 20 parts of 3'-phenyl-7-diethylamino-2,2'-spirodi-(2H-1-benzopyran) in 3,000 parts of methylene chloride was filtered through a pressure filter and then applied onto a 500 mm wide, 12 μm thick polyethylene terephthalate foil using a knife coater. After drying, a 21 μm thick heat-sensitive mask-forming layer was obtained. A 30 μm thick polyethylene cover sheet was laminated onto this, as a protective film.

Using a few drops of ethanol, the resulting resist film was laminated with the polyethylene terephthalate foil onto the photosensitive layer of a commercial photopolymerizable nylon-based letterpress printing plate. The polyethylene protective film was removed, and the heat-sensitive mask-forming layer was exposed imagewise to a 100 W $CO_2$ laser through a photographic negative (screen spacing: 48 lines/cm). Those parts of the layer irradiated by the laser beam underwent a color change imagewise from slightly yellow to intense blue.

The image-recording material was then exposed completely through the mask film for 10 minutes in a commercial exposure unit (containing 8 low-pressure fluorescence tubes of 20 W each). The blue mask film was then removed, and the printing plate was washed out with a 7:2:1 mixture of propanol, ethanol and water. Since photopolymerization occurred only under the blue areas of the mask film, the resulting photopolymeric relief image gave prints of excellent quality when used in a proof press.

EXAMPLE 3

This example describes the production and function of a negative-working UV mask produced using a resist film according to the invention.

A solution of 20 parts of polyvinyl alcohol, 0.5 part of 4-dimethylaminobenzophenone hydrochloride, 0.5 part of p-toluene sulfonic acid and 5 parts of n-butanol in 200 parts of water was cast on a 25 μm thick polyester foil, and was dried to give a virtually transparent 25 μm thick layer.

The resulting resist film was placed on top of a commercial, negative-working, pre-exposed offset printing plate, and was subjected imagewise to heat radiation on the basis of a photographic positive, as described in Example 2. The laminate was then exposed completely to UV radiation (low-pressure mercury fluorescence tubes) in an exposure unit for 1 minute, the mask layer was removed and the exposed offset printing plate was further processed by developing and drying in a conventional manner to give a finished printing plate. When used in a proof press, this plate gave excellent printed copies.

EXAMPLE 4

A commercial 45 μm thick photopolymerizable dry resist was laminated onto a copper-plated epoxy plate as conventionally used for the production of printed circuit boards. After the base film of the dry film resist had been removed, the dry film resist described in Example 1 was laminated on by a dry-lamination method, and imagewise irradiation with heat was carried out by means of an IR laser, using a pattern of an electrical circuit.

Complete exposure to actinic light was then carried out for half a minute, after which the mask film was removed and the exposed, photopolymerized resist layer was washed out with 1,1,1-trichloroethane. The resulting solid resist layer covered imagewise the copper surface corresponding to the circuit diagram. The flanks of the resist image were excellent.

We claim:

1. A resist film which comprises a dimensionally stable base (B), which is transparent to actinic light in the wavelength range from 300 to 420 nm, and a mask-forming layer (ML) which is applied on the base, wherein the said layer (ML) is sensitive to heat radiation and contains a thermochromic system which, when irradiated with an IR laser having a wavelength greater than 1.00 μm, undergoes an irreversible change in its absorption spectrum in the range from 300 to 420 nm so that the optical density of the mask-forming layer (ML) in this wavelength range changes by not less than 1.3 units.

2. A resist film as claimed in claim 1, wherein the mask-forming layer (ML) has an optical density in the wavelength range from 300 to 420 nm of not more than 0.5, and, as a result of irradiation with heat, the absorption of actinic light in this wavelength range by the layer (ML) increases.

3. A resist film as claimed in claim 1, wherein the mask-forming layer (ML) has an optical density in the wavelength range from 300 to 420 nm of not less than 1.8, and, as a result of irradiation with heat, the absorption of actinic light in this wavelength range by the layer (ML) decreases.

4. A resist film as claimed in claim 1, wherein the mask-forming layer (ML) contains a thermochromic system comprising (a) a sulfonic acid ester and (b) an aromatic amine or the hydrochloride of an aromatic amine.

5. A resist film as claimed in claim 1, wherein the mask-forming layer contains a polymeric binder in addition to the thermochromic system.

6. A resist film as claimed in claim 1, wherein the mask-forming layer (ML) additionally contains a visible, thermochromic indicator system.

7. A process for the production of an optical mask, wherein a resist film consisting of a dimensionally stable base (B), which is transparent to actinic light in the wavelength range from 300 to 420 nm, and a mask-forming layer (ML) as claimed in claim 1 is exposed imagewise to an IR laser having a wavelength greater than 1.00 μm.

* * * * *